United States Patent [19]

Frame

[11] 4,400,758

[45] Aug. 23, 1983

[54] CAPACITANCE SWITCH ARRANGEMENT

[75] Inventor: Norman J. Frame, Whitefish Bay, Wis.

[73] Assignee: W. H. Brady Co., Milwaukee, Wis.

[21] Appl. No.: 278,658

[22] Filed: Jun. 29, 1981

[51] Int. Cl.³ ............................................. H01G 5/16
[52] U.S. Cl. ............................. 361/290; 200/DIG. 1; 361/288; 400/479.1
[58] Field of Search .............. 361/283, 288, 290, 328, 361/329; 400/479.1; 340/365 C; 200/DIG. 1, 159 B

[56] References Cited

U.S. PATENT DOCUMENTS 3,797,630 3/1974 Zilkha .............................. 400/479.1
3,921,167 11/1975 Fox ..................................... 361/288
3,951,250 4/1976 Pointon et al. ............... 200/DIG. 1

*Primary Examiner*—B. A. Reynolds
*Assistant Examiner*—Alfred S. Keve

[57] ABSTRACT

A capacitance-type membrane switch in which ordinarily spaced-apart contacts are positioned other than directly over an associated capacitance spacing element with an inner insulating layer and outer conductive portions.

8 Claims, 4 Drawing Figures

4,400,758

CAPACITANCE SWITCH ARRANGEMENT

FIELD OF THE INVENTION

This invention relates to capacitance-type switches.

BACKGROUND OF THE INVENTION

In a capacitance-type switch of movable key acts to change capacitance, and the change in capacitance is then sensed for switching action. In my U.S. Pat. appln. Ser. No. 228,118, now U.S. Pat. No. 4,367,385, I describe a capacitance switch with a plurality of movable contacts, for separate switching elements, positioned above a common capacitance spacing element with conductive portions on its upper and lower surfaces. Because the capacitance spacing element has a large area, there is a large difference between unactuated and actuated capacitances, for a greater signal-to-noise ratio.

SUMMARY OF THE INVENTION

I have discovered that by providing a second contact aligned with and ordinarily spaced from a movable contact and electrically connected to a conductive portion of a capacitance spacing element, the capacitance spacing element can be located other than directly adjacent the contacts, and switching elements remotely spaced from one another can share a common capacitance spacing element. Thus, it is possible to have increased manufacturing flexibility in locating the positions of the switching elements at the same time that the capacitance spacing elements are being used efficiently and the size of the switching matrix and detection circuitry may be kept down.

In preferred embodiments additional contacts are positioned over a capacitance spacing element to provide additional switching elements; a plurality of capacitance spacing elements are used in a single switch; the contacts are arranged in positions corresponding to the positions of typewriter keys and the capacitance spacing elements are arranged in rows corresponding to typewriter key rows; additional pairs of contacts are arranged in positions corresponding to positions of numerical computation keys spaced from the typewriter keys, and one of each pair of these additional contacts is connected to a capacitance spacing element in a typewriter key row; an end of the capacitance spacing element is folded over so that a conductive portion on it can be electrical communication with a conductor which is for connection to external electrical circuitry and which is carried by a different switch sheet than the spacing element is carried by; and another end of the spacing element is folded over in the other direction so that it can be in electrical communication with a conductor connected to a contact carried by the same sheet that the capacitance spacing element is carried by.

DESCRIPTION OF THE PREFERRED EMBODIMENT

The structure and operation of the preferred embodiment of the invention will now be described after first briefly describing the drawings.

DRAWINGS

STRUCTURE

Figure 1:
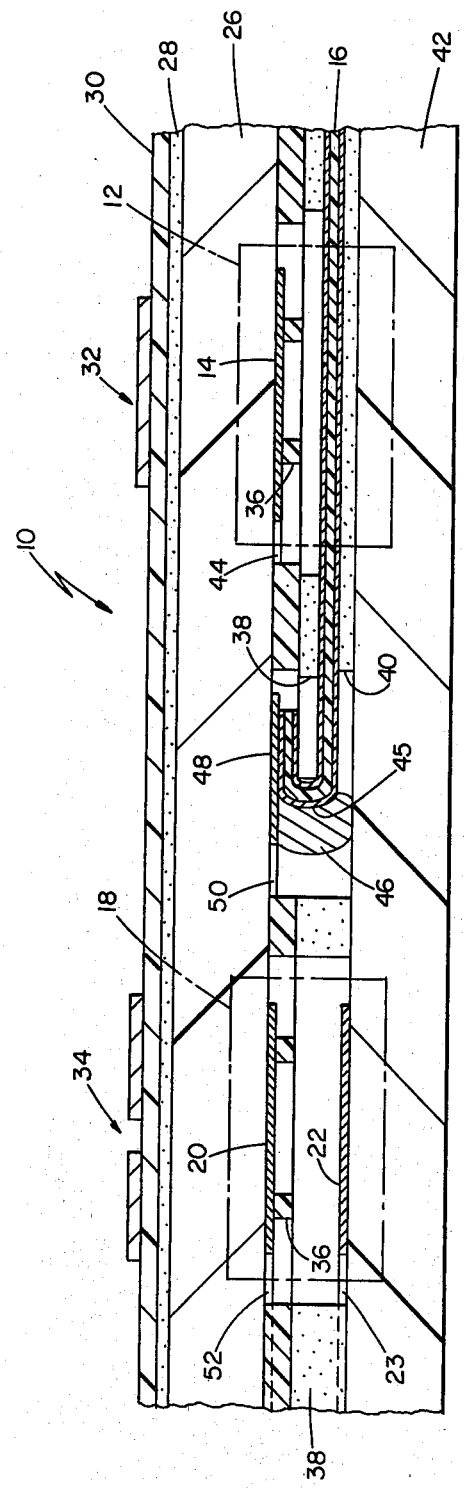
FIG. 1 is a vertical sectional view, taken at 1—1 of FIG. 2 through a pair of adjacent switching elements, of a portion of a capacitance switch according to the invention.

Referring to FIG. 1, there is shown a portion of capacitance switch 10 having switching elements arranged in positions corresponding to positions of keys of a computer terminal. Switch 10's construction is similar to that described in detail in my U.S. Pat. appln. Ser. No. 228,118, which is hereby incorporated by reference. Switch 10 has a plurality of switching elements with their movable contacts located directly over elongated capacitance spacing elements (e.g., switching element 12 with movable contact 14 over elongated capacitance spacing element 16) and a plurality of switching elements horizontally spaced from their associated elongated capacitance spacing elements (e.g., switching element 18 with movable upper contact 20 over lower contact 22 connected by conductor 23 to elongated capacitance spacing element 24—FIG. 4).

Movable contacts 14, 20 are copper pads vacuum-deposited on the lower surface of flexible polyester sheet 26. Adhered above layer 26 by adhesive layer 28 is plastic overlay 30 having indicia inked thereon, index 32 being the letter "Z", index 34 being the symbol "SH". (See FIG. 2.) On the bottom surface of flexible sheet 26 ad contacts 14, 20 is cured epoxy layer 36, which is interrupted in the switching element regions to leave the majority of the lower surfaces of contacts 14, 20 exposed. Elongated capacitance spacing element 16 is adhered therebelow by adhesive layer 38 and consists of $\frac{1}{4}$ mil thick polyester with RF sputtered layers of aluminum on the upper and lower surfaces. The bottom surface of capacitance spacing element 16 is attached by adhesive layer 40 to bottom polyester sheet 42. Contact 22 is carried by bottom sheet 42.

Each switching element includes an air capacitor (e.g., contact 20 separated from contact 22 by air; contact 14 separated from upper conductive surface of capacitance spacing element 16 by air) of low capacitance connected in series with a polyester capacitor (e.g., large-area capacitance spacing element 16) of high capacitance. The capacitances of the switching elements are thus low when the contacts are in the ordinarily open positions shown in FIG. 1, and high when the air capacitors are short-circuited by bringing the upper movable contacts in electrical engagement with the upper surfaces of their associated capacitance switching elements.

Figure 3:
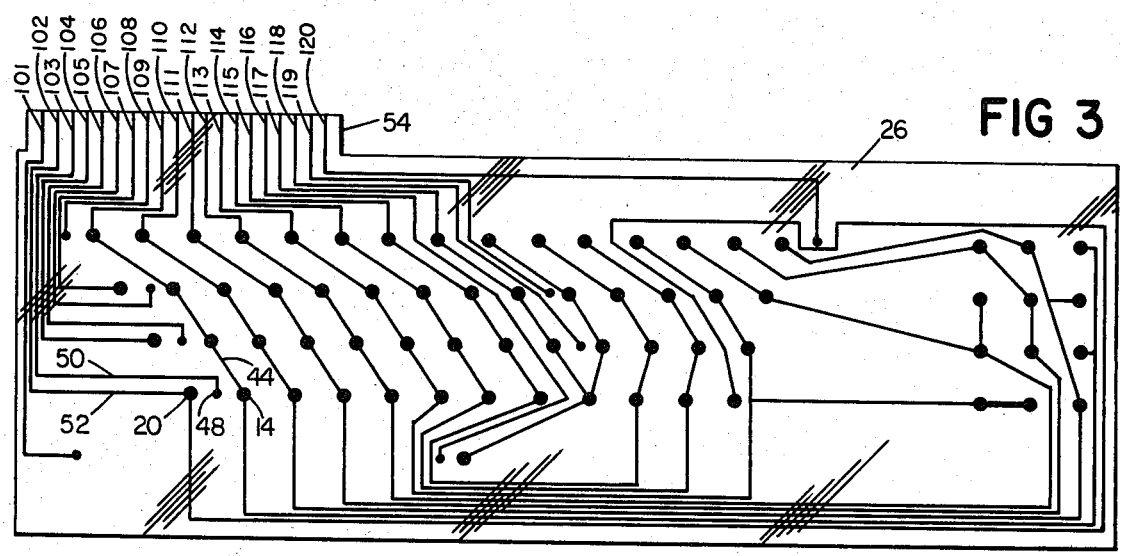
FIG. 3 is a plan view of a transparent sheet of said capacitance switch shown with conductive portions on its lower surface.

Connections to external circuitry of the type described in the above-mentioned patent application are provided by conductors carried by the lower surface of polyester sheet 26 (FIGS. 1 and 3). Contact 14 is connected to column conductor 44. The lower aluminum surface of capacitance spacing element 16 is connected at its folded-over end 45 by conductive epoxy 46 and conductive pad 48 to row conductor 50. Contact 20 is connected to column conductor 52. Row conductor 50, column conductors 44, 52 and other similar conductors are all connected to tail 54 for connection to external circuitry.

Figure 2:
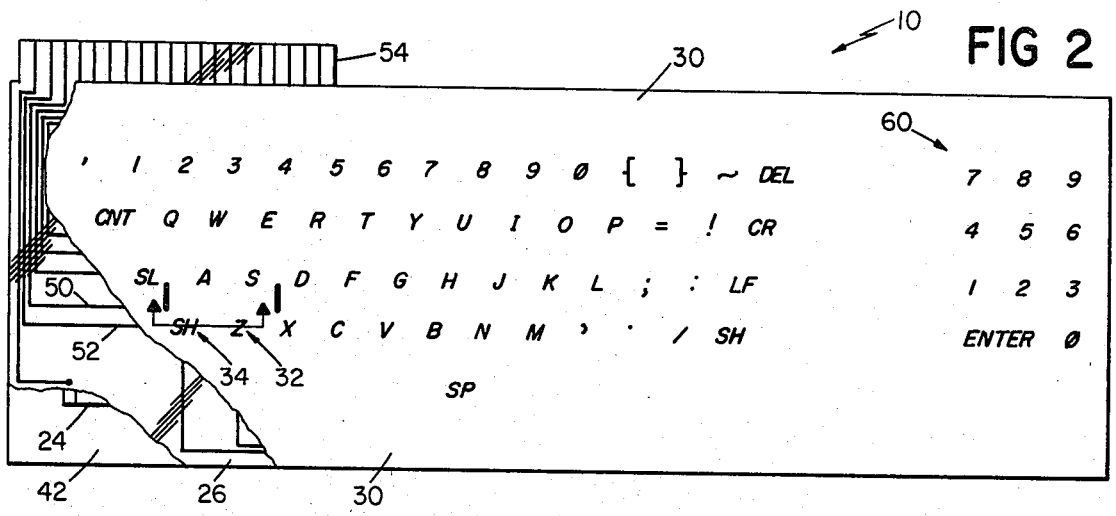
FIG. 2 is a plan view, partially broken away, of a capacitance switch according to the invention.

FIG. 2 shows overlay 30 with its indicia associated withe the plurality of switching elements, and FIG. 3 shows transparent flexible sheet 26 with conductive members on its bottom, the contacts being in the same orientation as their associated indicia shown in FIG. 2. The conductive members include a plurality of movable contacts (e.g., larger circles similar to contacts 14, 20), row conductive pads (e.g., smaller circles similar to conductive pad 48), and conductive lines (e.g., conductive lines 44, 50, 52) ending at tail 54.

Figure 4:
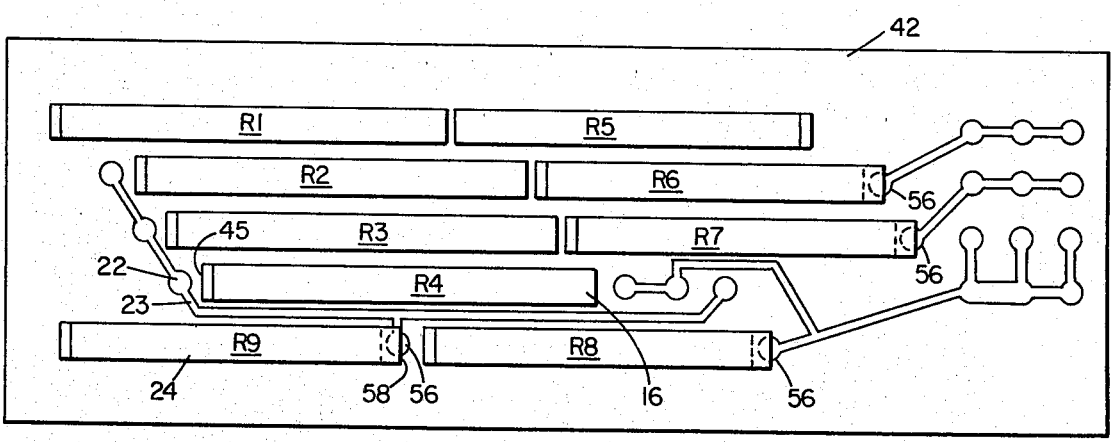
FIG. 4 is a plan view of the bottom sheet of said capacitance switch shown with conductive portions and capacitance elements on its upper surface.

FIG. 4 shows bottom layer 42 with nine elongated capacitance spacing elements designated $R_1$ through $R_9$ to indicate rows of switching elements, lower switch contacts (e.g., contact 22), lower contact pads 56 (similar to conductive pad 48), and conductive lines (e.g., line 23). A vertical solid line on a capacitance spacing element indicates that the element is folded over upward, as element 16 (also designated $R_4$) is, to make electrical contact of the lower conductive surface with a pad on the bottom of upper sheet 26. A vertical dashed line on a capacitance spacing element indicates that the element is folded over downward to make contact of its upper conductive surface with a pad 56 on bottom sheet 42; e.g., the upper surface of end 58 of row 9 is electrically connected to pad 56 with conductive epoxy similar to epoxy 46. The folded over construction of capacitance spacing elements permits carrying all of the conductors for connection to external circuitry by flexible polyester sheet 26. The folded over construction also provides a simple connection between the upper surfaces of the capacitance spacing elements and the remotely located contacts.

The following table lists the numerical designation for conductors on tail 54 in FIG. 3 associated with the rows and the columns of the switch contacts and switching elements.

| Tail Conductor Designation | Row or Column |
|---|---|
| 101 | Row 9 |
| 102 | Shift Column |
| 103 | Row 4 |
| 104 | Shift Lock Column |
| 105 | Row 3 |
| 106 | Row 2 |
| 107 | Control Column |
| 108 | Row 1 |
| 109 | Column 1 |
| 110 | Column 2 |
| 111 | Column 3 |
| 112 | Column 4 |
| 113 | Column 5 |
| 114 | Column 6 |
| 115 | Column 7 |
| 116 | Row 8 |
| 117 | Column 8 |
| 118 | Row 7 |
| 119 | Row 6 |
| 120 | Row 5 |

The following tables present the row and column information for the switching element indicia. Subscripts next to numbers indicate numerical computation indicia 60 for switching elements located to the right of the switching elements associated with typewriter key indicia (FIG. 2).

| | | | | Column | | | | |
|---|---|---|---|---|---|---|---|---|
| Row | 1 | 2 | 3 | 4 | 5 | 6 | 7 | 8 |
| 1 | ' | 1 | 2 | 3 | 4 | 5 | 6 | 7 |
| 2 | Q | W | E | R | T | Y | U | I |
| 3 | A | S | D | F | G | H | J | K |
| 4 | Z | X | C | V | B | N | M | , |
| 5 | | DEL | ~ | { | } | $0$ | 9 | 8 |
| 6 | $9_1$ | $8_1$ | $7_1$ | CR | ! | = | P | O |
| 7 | | $6_1$ | $5_1$ | $4_1$ | LF | : | ; | L |
| 8 | | $3_1$ | $2_1$ | $1_1$ | ENTER | / | . | |

| | Column | | |
|---|---|---|---|
| Row | Shift Key Column | Shift Lock Column | Control Column |
| 9 | SH | SL | CNT |

It is seen that an eight by eight X-Y matrix results for the majority of indicia and their associated switching elements. For example switching element 12 ("Z") corresponds to row 4 (tail conductor 103) and column 1 (tail conductor 109). The three switching elements in row 9 have columns exclusively used by a single switching element. For example, switching element 18 ("SH") corresponds to to row 9 (tail conductor 101), and the "Shift" column (tail conductor 102).

By providing lower contacts that are electrically connected to their associated capacitance spacing elements, manufacturing flexibility is greatly increased in that the contacts do not have to be placed directly over the associated capacitance spacing elements. Thus switching elements spaced from each other on the switch can share a common capacitance spacing element. For example, the numerical computation switching elements associated with indicia 60 on the right side of FIG. 2 are all connected to the capacitance spacing elements designated rows 6, 7 and 8 (FIG. 4). This permits using the capacitance spacing elements efficiently and keeping the size of the switching matrix and detection circuitry down.

OPERATION

In operation a switching element is activated by depressing overlay 30 at a location associated with an index. For example if overlay 30 is depressed at index 32, contact 14 engages the upper surface of capacitance spacing element 16, and this in effect eliminates one of the two capacitors in series (air capacitor between contact 14 and the upper conductive surface of element 16), leaving the polyester capacitor (capacitance spacing element 16), and causing the capacitance of the circuit through switching element 12 to increase enormously. The increase of capacitance appears between tail conductor 103 and tail conductor 109 and is detected by the detection circuitry (not shown) as row 4, column 1. Similarly, if switching element 18 is activated by depressing overlay 30 at the location of index 34, contact 20 engages contact 22, again eliminating the air capacitor, leaving the polyester capacitor (capacitance spacing element 24), and causing the capacitance of circuit between tail conductors 101 and 102 to increase enormously. This increase in capacitance is detected by the detection circuitry as row 9 and the "Shift" column. The operation of the switching elements associated with the other indicia on FIG. 2 is similar.

Other embodiments are within the scope of the appended claims. For example, the indicia could be domed to provide tactile feel for the switching elements. Or, the substrate could be for example a printed circuit board, and the flexible sheet could be flexed by the lower extremities of full travel keys of an ordinary keyboard.

What is claimed is:

1. A capacitance switch comprising
   a substrate,
   a first conductive contact carried by said substrate,
   a flexible sheet extending over said substrate,
   a second conductive contact carried by said flexible sheet and aligned with and ordinarily spaced from said first contact,
   a capacitance spacing element carried by one of said substrate and said flexible sheet, located other than directly under or above said contacts,
   said capacitance spacing element comprising
      an inner insulating layer and
         outer conductive portions, one said conductive portion being electrically connected to one said contact, and
   first means for connection of the other said contact and the other said conductive portion to external circuitry,
   whereby said flexible sheet may be flexed to vary the spacing between said contacts to increase the capacitance of said switch.

2. The switch of claim 1 further comprising a third contact carried by the other of said substrate and said flexible sheet that said capacitance spacing element is carried by, said third contact being electrically connected to second means for connection to external circuitry and being aligned with and ordinarily spaced from said conductive portion not electrically connected to said first means for connection to external circuitry, whereby said flexible sheet may be flexed to vary the spacing between said third contact and said capacitance spacing element.

3. The switch of claim 2 further comprising a fourth contact carried by the other of said substrate and said flexible sheet that said capacitance spacing element is carried by, electrically connected to third means for connection to external circuitry, aligned with and ordinarily spaced from said conductive portion not electrically connected to said first means for connection to external circuitry, and spaced from said third contact, whereby said flexible sheet may be flexed to vary the spacing between said fourth contact and said capacitance spacing element.

4. The switch of claim 2 further comprising a plurality of said capacitance spacing elements and fifth contacts associated with said plurality of capacitance spacing elements, some of said fifth contacts being aligned with and ordinarily spaced from conductive portions of said plurality of capacitance spacing elements, some of said fifth contacts being aligned in ordinarily spaced pairs and being remotely located from but electrically connected to their associated capacitance spacing elements.

5. The switch of claim 4 wherein said contacts are arranged in positions corresponding to positions of typewriter keys, said capacitance elements being aligned with rows of said typewriter key positions.

6. The switch of claim 5 wherein sixth contacts are provided and arranged in pairs in positions corresponding to positions of numerical computation keys, said sixth contacts being located remotely on said switch from said contacts having positions corresponding to said positions of typewriter keys, one said contact of each said pair being electrically connected to a conductive portion of a capacitance spacing element aligned with a corresponding typewriter row.

7. The switch of claim 1 wherein an end of said capacitance spacing element is folded over in the direction away from the sheet that carries it, and said other said conductive portion is in electrical communication with a conductor carried by the sheet that said spacing element is not carried by, whereby all conductors comprising electrical connections to external circuitry can be carried by a single sheet.

8. The switch of claim 7 wherein another end of said capacitance spacing element is folded over in the direction toward the sheet that carries it, and said one conductive portion is in electrical communication with a conductor carried by the sheet and electrically connected to said one contact.

* * * * *